(12) United States Patent
Mannhold

(10) Patent No.: US 12,334,697 B2
(45) Date of Patent: Jun. 17, 2025

(54) SOLDERING AID, ASSEMBLY, AND METHOD FOR SECURING A STRANDED CORE ON A CONTACT SURFACE OF A PRINTED CIRCUIT BOARD

(71) Applicant: MD ELEKTRONIK GmbH, Waldkraiburg (DE)

(72) Inventor: Dimitri Mannhold, Muehldorf a. Inn (DE)

(73) Assignee: MD ELEKTRONIK GMBH, Waldkraiburg (DE)

( * ) Notice: Subject to any disclaimer, the term of this patent is extended or adjusted under 35 U.S.C. 154(b) by 386 days.

(21) Appl. No.: 17/900,924

(22) Filed: Sep. 1, 2022

(65) Prior Publication Data
US 2023/0083275 A1 Mar. 16, 2023

(30) Foreign Application Priority Data
Sep. 15, 2021 (DE) .................. 10 2021 123 830.7

(51) Int. Cl.
*H01R 43/02* (2006.01)
*H01R 4/02* (2006.01)

(52) U.S. Cl.
CPC ..... *H01R 43/0256* (2013.01); *H01R 43/0263* (2013.01); *H01R 4/027* (2013.01)

(58) Field of Classification Search
CPC .......... H01R 43/0256; H01R 43/0263; H01R 4/027; H01R 9/0515; H01R 12/53; H05K 2201/10393; H05K 3/3405; H05K 2201/10356
See application file for complete search history.

(56) References Cited

U.S. PATENT DOCUMENTS

| | | | |
|---|---|---|---|
| 5,532,659 A | 7/1996 | Dodart | |
| 6,752,658 B2 * | 6/2004 | Jones | H01R 13/6585 439/79 |
| 9,882,293 B1 | 1/2018 | Chen | |

FOREIGN PATENT DOCUMENTS

| | | |
|---|---|---|
| DE | 69107099 T2 | 5/1995 |
| DE | 69708747 T2 | 8/2002 |
| DE | 102008020969 A1 | 11/2009 |
| DE | 102008024446 A1 | 11/2009 |
| DE | 102019210535 A1 | 1/2020 |
| DE | 102020119422 A1 | 1/2022 |
| DE | 102020119423 A1 | 1/2022 |
| EP | 2690712 A2 | 1/2014 |
| JP | 2002190359 A | 7/2002 |
| WO | WO 02084808 A1 | 10/2002 |
| WO | WO 2016104586 A1 | 6/2016 |
| WO | WO 2019055911 A1 | 3/2019 |

* cited by examiner

*Primary Examiner* — Briggitte R. Hammond
(74) *Attorney, Agent, or Firm* — LEYDIG, VOIT & MAYER, LTD.

(57) ABSTRACT

A soldering aid for securing a stranded core of a cable on an electrical contact surface of a printed circuit board includes an outer part having a receptacle and a bearing surface, and an inner part that is displaceably received inside the receptacle of the outer part. The inner part has an access opening through which the contact surface is accessible and can be fastened to the outer part in an assembly position. In an inserted position of the inner part in the outer part, an insertion opening in the inner part is aligned with an insertion opening in the outer part for inserting the stranded core of the cable.

23 Claims, 7 Drawing Sheets

SOLDERING AID, ASSEMBLY, AND METHOD FOR SECURING A STRANDED CORE ON A CONTACT SURFACE OF A PRINTED CIRCUIT BOARD

CROSS REFERENCE TO RELATED APPLICATIONS

This application claims benefit to German Patent Application No. DE 10 2021 123 830.7, filed on Sep. 15, 2021, which is hereby incorporated by reference herein.

FIELD

The invention relates to a soldering aid for securing a stranded core of a cable on an electrical contact surface of a printed circuit board, to an assembly, and to a method for securing a stranded core of a cable on an electrical contact surface of a printed circuit board.

BACKGROUND

When working cables, it is often the case that a stranded core of the cable, in particular the inner conductor of a data cable formed as a coaxial cable, has to be mechanically fastened to a contact surface of a printed circuit board (PCB) in an electrically conductive manner. The stranded core of the cable is often fastened by soldering, in which a solder material is applied to the stranded core or to the contact surface and the solder is then melted by supplying heat in order thereafter to solidify and connect the stranded core to the material of the contact surface.

For the soldering, it is necessary to place the stranded core on the contact surface in a preparatory step and to hold it in a manner secured at the defined location on the contact surface throughout the liquefaction of the solder.

To secure the stranded core of an end-stripped cable on the contact surface of a printed circuit board, soldering aids are known in the field. A soldering aid can be a component into or onto which the stranded core is inserted such that the stranded core, which, for example, can be formed as an exposed inner conductor of a coaxial cable, is arranged and received in the soldering aid. The soldering aid is fastened on the printed circuit board such that the inserted stranded core is held on the contact surface of the printed circuit board in a defined position, which is as reproducible as possible, at least for the duration of the soldering.

In automated manufacturing, it is often required to mount high numbers of stranded cores of extremely small diameter on the contact surface of a printed circuit board and fasten them by means of soldering in a short period of time; in particular, a plurality of stranded cores oriented in parallel with one another need to be placed on contact surfaces of a printed circuit board, which are oriented in parallel with one another, and then soldered to the contact surface as far as possible in one work step.

EP 2 690 712 A2 describes a soldering aid that is formed as a planar, single-piece blank having a hole, the soldering aid being secured to the edge of the printed circuit board substantially perpendicularly to the plane thereof, and a stripped end portion of a coaxial cable abutting the rim of the hole such that the stranded core of the coaxial cable can be directed toward a contact surface through the hole and soldered thereon. In the process, the blank extends through bores in the printed circuit board, in which bores it has to be fastened using securing means.

WO 2016/104586 A1 describes, with reference to FIG. 16, a soldering aid formed as a single-piece molded part, the soldering aid being clamped in a slot in the printed circuit board, and the soldering aid having an insertion opening through which the end-stripped portion of a coaxial cable on one side is inserted in such a way that the stranded core on the other side is positioned on the contact surface, in order then to be soldered. On the top, the soldering aid has a notch through which a cable shield of the coaxial cable becomes accessible.

WO 02/084808 A1 describes a device for positioning a coaxial cable on a conductor strip of a printed circuit board, the device having a single-piece molded part that is fastened in a slot in the printed circuit board on the top and on the bottom of the printed circuit board, the molded part receiving a stripped end of the coaxial cable at an insertion opening, which end is still enclosed at an outlet of the insertion opening by the insulator of the coaxial cable. The device is arranged at such an angle to the plane of the printed circuit board that the stranded core of the coaxial cable is positioned so as to be pressed against the conductor strip at said angle in order then to be soldered.

U.S. Pat. No. 5,532,659 A describes a substantially U-shaped part as a soldering aid, a stripped end portion of a coaxial cable being received at the bottom of the U, and the exposed inner conductor of the coaxial cable resting on a conductor strip of a multi-layer printed circuit board between the legs of the U. A cap is used to electromagnetically shield the otherwise exposed connection of the stranded core or inner conductor of the cable to the conductor strip.

SUMMARY

In an embodiment, the present disclosure provides a soldering aid for securing a stranded core of a cable on an electrical contact surface of a printed circuit board. The soldering aid includes an outer part having a receptacle and a bearing surface, and an inner part that is displaceably received inside the receptacle of the outer part. The inner part has an access opening through which the contact surface is accessible and can be fastened to the outer part in an assembly position. In an inserted position of the inner part in the outer part, an insertion opening in the inner part is aligned with an insertion opening in the outer part for inserting the stranded core of the cable

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
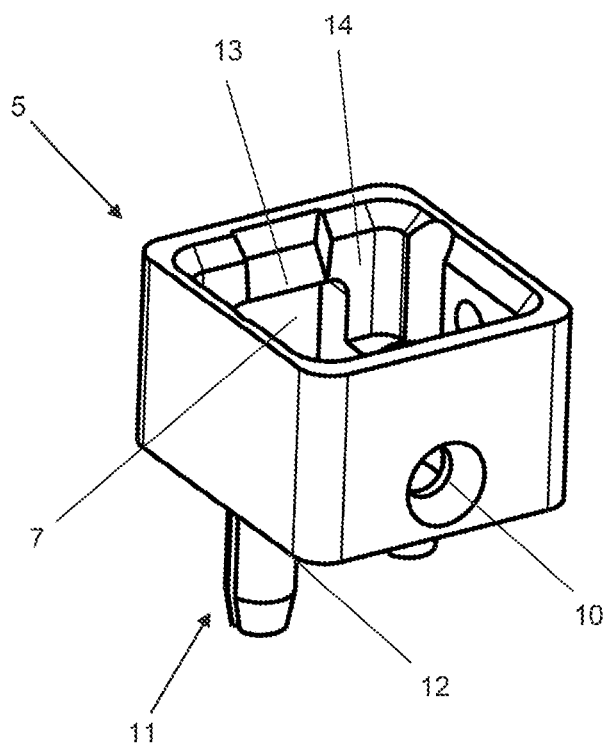
FIG. 1 is a perspective view of an outer part of an embodiment example of a soldering aid according to the invention.

Embodiments of the present invention provide a soldering aid and a method for securing a stranded core on a contact surface of a printed circuit board such that a multiplicity of stranded cores of small diameter can be processed in an automated manner.

According to an embodiment of the invention, the soldering aid for securing a stranded core of a cable on an electrical contact surface of a printed circuit board such that a multiplicity of stranded cores of small diameter can be processed in an automated manner, comprises an outer part having a bearing surface, and an inner part, wherein the inner part is displaceably received inside a receptacle of the outer part, wherein the inner part has an access opening to the contact surface and can be fastened to the outer part in an assembly position, and wherein, in an inserted position, an insertion opening in the inner part is aligned with an insertion opening in the outer part for inserting the stranded core of the cable.

According to an embodiment of the invention, the method, which preferably can be carried out using the soldering aid according to an embodiment of the invention, for securing a stranded core of a cable on an electrical contact surface of a printed circuit board such that a multiplicity of stranded cores of small diameter can be processed in an automated manner, comprises the steps of:

supplying a soldering aid comprising an outer part and an inner part, which is displaceably received inside a receptacle of the outer part, inserting the stranded core of the cable in an inserted position, in which an insertion opening in the inner part is aligned with an insertion opening in the outer part for inserting the stranded core of the cable, and moving the inner part inside the receptacle of the outer part into an assembly position, in which the inner part is fastened to the outer part, wherein, in the assembly position, an access opening of the inner part makes the electrical contact surface of the printed circuit board accessible, and wherein, in the assembly position, the outer part is fastened to the printed circuit board in order to secure the stranded core on the contact surface.

The soldering aid is formed in two parts and comprises the outer part and the inner part, which is received inside the receptacle of the outer part so as to be displaceable in relation to the outer part. The inner part and the outer part can be produced structurally separately from one another. Displacing the inner part in the outer part achieves an assembly position in which the stranded core is secured on the contact surface to such an extent that, in a subsequent step, solder material mechanically connects the stranded core to the contact surface in an electrically conductive manner as a result of heat being supplied. For this purpose, the inner part has the access opening to the contact surface on the printed circuit board, through which access opening the solder and heat, for example as a heating finger or a laser beam, can be supplied in order to melt the solder to the stranded core resting on the contact surface. The inner part is fastened to the outer part in the assembly position.

The two-part configuration of the soldering aid, in particular the displaceability of the inner part inside the receptacle of the outer part, makes it possible to establish an inserted position, in which an insertion opening in the inner part is aligned with an insertion opening in the outer part for inserting the stranded core of the cable, such that the stranded core can be inserted in a substantially straight manner, in parallel with the surface of the contact surface. The position of the inner part in relation to the outer part in the insertion position can be different from the position of the inner part in relation to the outer part in the assembly position; in particular, the assembly position can be reached by displacing the inner part from the inserted position. The assembly position can in particular represent an end position of the inner part in relation to the outer part, in which end position the inner part cannot be displaced any further inside the receptacle of the outer part and the inner part is fixed in place on the outer part. When the inner part is fixed in place on the outer part, the stranded core is secured on the contact surface. The outer part has a bearing surface by which the outer part can be positioned on the surface of the printed circuit board.

For the soldering aid, it is preferably provided that the inner part forms, in some portions on an outside, a guide-surface pair together with a portion of the inside of the receptacle of the outer part. The at least one guide-surface pair simplifies the defined displaceability of the inner part in relation to the outer part since the inner part can be prevented from becoming jammed in the receptacle and rubbing of the inner part on the outer part is reduced. In this case, the at least one guide-surface pair is provided between the inner part and the outer part along the entire displacement path. The formation of the at least one guide-surface pair also prevents the inner part from becoming jammed in relation to the inside of the receptacle of the outer part while the inner part is being displaced.

In terms of the formation of the at least one guide-surface pair, the portion, forming the guide-surface pair, of the outside of the inner part is preferably substantially cylindrical. In this case, the cylindrical portion on the outside of the inner part can, for example, form the at least one guide-surface pair together with a planar portion on the inside of the outer part; in this case, the at least one guide-surface pair is formed by a substantially linear surface portion extending along the displacement path of the inner part in relation to the outer part.

For the soldering aid, it is preferably also provided that the inner part can be fastened to the outer part in the assembly position by means of a latching connection. As a result, additional means for fixing the inner part in place on the outer part can be avoided, thereby simplifying the construction. In addition, the inner part can be fastened to the outer part automatically as soon as the inner part reaches the assembly position in relation to the outer part.

To configure the latching connection, a latching projection is preferably formed on the outside of the inner part and establishes the latching connection together with an undercut on the inside of the outer part.

To fix the soldering aid in place on the printed circuit board, a fastener for fixing the soldering aid in place on the printed circuit board is preferably provided on the outer part and/or on the inner part. Forming a portion of the outer part and/or of the inner part as a fastener makes it possible to omit additional means for fastening, such as screws or pins, which otherwise make it complex to fix the soldering aid in place on the surface of the printed circuit board in an automated manner.

To form the fastener, in a preferred embodiment the fastener can be actuated by displacing the inner part into the assembly position.

The fastener can preferably be configured such that the fastener on the outer part is formed as a spreading member having two or more spreading lugs forming a spreading gap, and a spreading pin being formed on the inner part and filling the spreading gap in the assembly position such that the spreading lugs can be braced against the printed circuit board.

For the soldering aid, it is furthermore preferably provided that the inner part can be displaced in relation to the outer part into a secured position, and the inner part and the outer part forming a pre-secured module when in the secured position.

By providing a secured position, the method can be carried out in a preferred manner such that the soldering aid is supplied in the secured position in which the inner part and the outer part form a pre-secured module, and the module is arranged on the printed circuit board before the stranded core is inserted. In this case, first the pre-secured module is arranged on the printed circuit board and then the stranded core is inserted in the secured position. The secured position can even correspond to the assembly position in which the inner part is fastened to the outer part and in which the outer part is fastened to the printed circuit board. Alternatively, the module can be moved out of the secured position and into the assembly position by further displacing the inner part in relation to the outer part.

The pre-secured module can be produced regardless of the assembly situation and can be supplied for securing the stranded core on the contact surface of the printed circuit board.

For the soldering aid, it is preferably provided, particularly as regards the aforementioned secured position, that a securing portion is formed on the outside of the inner part, and wherein a receiving portion that is substantially complementary to the securing portion is formed on the inside of the outer part, and wherein, when in a secured position, the securing portion is received in the receiving portion in a substantially interlocking manner. The securing portion extends only along a defined portion of the displacement path of the inner part in relation to the outer part and corresponds to a defined, reproducibly adjustable position of the inner part relative to the outer part. In particular, the securing portion can be provided as a projection having a defined shape on the outside of the inner part, the projection interacting with a depression of a complementary shape on the inside of the outer part. It goes without saying that the projection can also be provided on the inside of the outer part and interacts with a complementary depression on the outside of the inner part to allow the inner part to be fixed in place on the outer part in an interlocking manner in some portions.

To form the securing portion, preferably the securing portion is formed as studs and the receiving portion is formed as a recess having a shape that is complementary to the studs.

For the soldering aid, in particular for the inner part of the soldering aid, it is preferably provided that the insertion opening in the inner part is formed as a groove that is open in the direction of the displacement. While the inner part is being displaced in relation to the outer part, the groove receives a portion of the stranded core or of the cable sheath adjoining the stranded core.

In addition, for the soldering aid, in particular for the outer part of the soldering aid, it is preferably provided that the insertion opening in the outer part is formed as a through-bore. In this case, the through-bore is formed so as to be enclosed on all sides by the material of the outer part, such that the stranded core received in the through-bore maintains a defined distance from the surface of the printed circuit board.

Likewise, in the assembly position, the insertion opening in the inner part is preferably arranged in a manner offset from the insertion opening in the outer part. Owing to the offset, it is possible for the stranded core to be clamped with a bend formed between the insertion opening in the outer part and the insertion opening in the inner part, the bend providing the advantage whereby the stranded core can be clamped in the soldering aid with additional protection against tensile forces.

In addition, for the soldering aid it can be provided that an ancillary insertion opening is provided opposite the insertion opening in the inner part in the direction of the extension of the stranded core. The ancillary insertion opening can in particular be provided in order to receive and clamp the free end of the stranded core such that the stranded core can be securely held on the contact surface in a manner clamped at two points that are spaced apart from one another in the longitudinal direction of the stranded core.

Furthermore, for the inner part or the outer part, in particular for both the inner part and the outer part, it is preferably provided that the inner part and/or the outer part is/are formed as a single-piece molded part made of a metal or a plastics material, in particular as a plastics injection-molded part. The single-piece metal molded part can in particular be produced by milling or wire erosion.

Lastly, for the soldering aid, it is provided in a preferred embodiment that the inner part is entirely received inside the receptacle of the outer part in the assembly position.

An embodiment of the invention further relates to an assembly comprising a printed circuit board and a stranded core of a cable, the stranded core being fastened on a contact surface of the printed circuit board by means of a soldering aid formed according to an embodiment of the invention.

Figure 6:
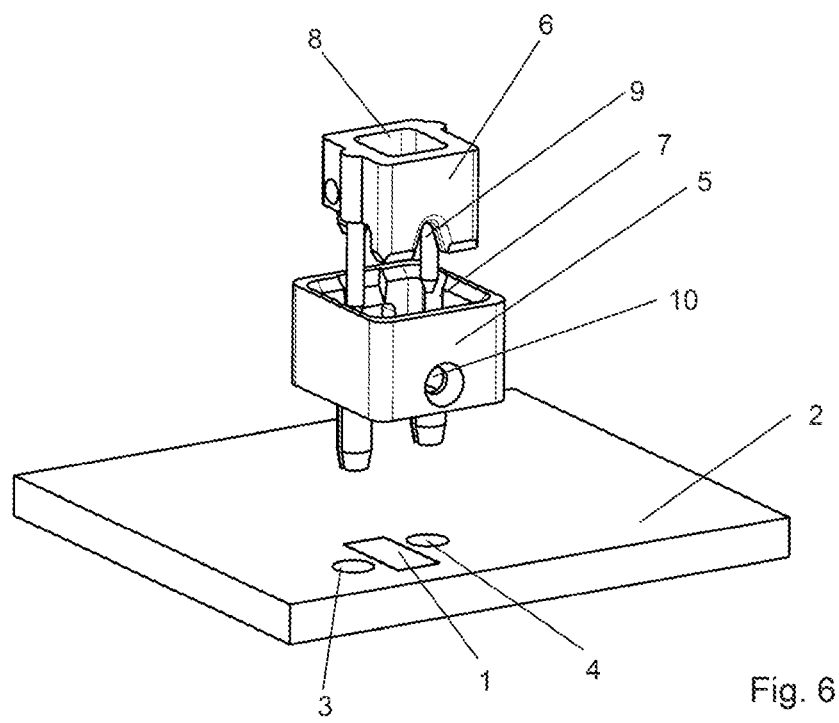
FIG. 6 is a perspective view of the embodiment example of the soldering aid according to the invention shown in FIG. 1 to FIG. 5, during the production of an embodiment example of an assembly according to the invention, and of a method step in an example implementation of the method according to the invention.

FIG. 6 is a perspective view of a soldering aid, the soldering aid being configured to secure a stranded core of an end-stripped cable on an electrical contact surface 1 of a printed circuit board 2 (PCB). Electronic components arranged on the printed circuit board 2 are connected to the contact surface 1 in an electrically conductive manner.

The contact surface 1 has a longitudinal extension, with two receiving bores 3, 4 for fastening the soldering aid to the printed circuit board 2 being provided on both sides, offset from one another in the direction of the longitudinal extension.

In the not yet fully assembled state shown in FIG. 6, the soldering aid has two components that are initially still structurally separate, and comprises an outer part 5, which has a bearing surface by which the outer part 5 rests on the surface of the printed circuit board 2 when in the assembled end position, and an inner part 6. The outer part 5 has a generally rectangular outer contour and, by its peripheral wall, encloses an opening such that a receptacle 7 is formed, which encloses the contact surface 1 when the soldering aid is in the assembly position. As shown by FIG. 6, the inner part 6 is oriented in relation to the receptacle 7 of the outer part 5 such that the inner part 6 can be displaceably received inside the receptacle 7 of the outer part 5, the inner part 6 being displaced toward the printed circuit board 2 into the assembly position, which will be described and explained in more detail below, in a direction perpendicular to the surface of the printed circuit board 2.

The inner part 6 has a substantially rectangular outer contour and, by its wall, encloses an access opening 8 that is formed as an opening surrounded by the wall, the access opening 8 enclosing the contact surface 1 in the assembly position such that access to the contact surface 1, in particular the application of heat in the form of a heating finger or by means of the beam of a laser, is possible through the access opening 8. The inner part 6 having the access opening 8 to the contact surface 1 can be fastened to the outer part 5 in the assembly position.

The inner part 6 has an insertion opening 9 on a bottom edge of one of the sides of the wall. In addition, the outer part 5 has an insertion opening 10 close to the bottom edge of the side wall of the wall. It can be seen in FIG. 6 that the insertion opening 9 in the inner part 6 is formed as a groove that is open in the direction of the displacement, i.e., toward the surface of the printed circuit board 2. It can also be seen that the insertion opening 10 in the outer part 5 is formed as a through-bore. In this case, the through-bore is formed close to the bottom edge of the side of the wall of the outer part 5, and specifically such that the through-bore extends through the wall from an outside of the outer part 5 to an inside of the outer part 5 such that the through-bore is enclosed by the material of the wall of the side wall. By contrast, the insertion opening 9 in the inner part 6 is formed as a groove that is open on one side.

In an inserted position (described in more detail below), the insertion opening 9 in the inner part 6, this insertion opening being formed as a groove that is open toward the printed circuit board 2, is aligned with the insertion opening 10 in the outer part 5 for inserting the stranded core of the cable, this insertion opening being formed as a through-bore, the two insertion openings being aligned such that the stranded core of the cable can be inserted into the soldering aid substantially in parallel with the surface of the printed circuit board 2 and at a distance from the surface of the printed circuit board 2.

In the embodiment example shown, the inner part 6 and the outer part 5 are each formed as a single-piece molded part, in particular as a plastics injection-molded part. In a modification of the embodiment example shown, the inner part and/or the outer part, in particular both the inner part and the outer part, can be formed as a single-piece metal molded part that is produced, for example, by means of milling or wire erosion. In particular, the metal molded part can effectively absorb and carry away the heat input during melting of the solder.

FIG. 1 is a perspective view of the outer part 5 of the soldering aid. It can be seen that on the outer part 5 there is provided a fastener for fixing the outer part 5 of the soldering aid in place on the printed circuit board. Therefore, in the assembled position in which the inner part 6 is fastened to the outer part 5 of the soldering aid, the outer part 5 is fastened to the printed circuit board directly and the inner part 6 is fastened to the printed circuit board indirectly.

The fastener comprises two spreading members on two opposite side walls of the wall of the outer part 5; the spreading members are identical and only the spreading member denoted by reference numeral 11 will be described in more detail.

The fastening member provided on the outer part 5 is formed as a spreading member 11 having two spreading lugs forming a spreading gap. One of the spreading lugs is denoted by reference numeral 12; the other spreading lug is substantially hidden by the front spreading lug. The two spreading lugs face one another, form a spreading gap with respect to one another, and taper conically toward their respective ends. On an outside, each spreading lug has a contour that is cylindrical in some portions, such that each spreading lug can be inserted into one of the receiving bores 3, 4 (FIG. 6) in the printed circuit board and can form-fittingly about the inner wall of the receiving bore in some portions. The mutually facing insides of the spreading lugs each have an inner contour that is hollow-cylindrical in some portions, in such a way that a spreading pin formed on the inner part fills the spreading gap in the assembly position such that the spreading lugs can be braced against the printed circuit board, specifically against the inner wall of the receiving bore.

The two spreading lugs 12 are each formed on the bottom edge of the wall surrounding the receptacle 7 and protrude toward the surface of the printed circuit board substantially perpendicularly to the bearing surface of the bottom edge of the wall, each by the same distance. On the outside, the two spreading lugs 12 each have a conical bevel at their respective ends to make it simpler to insert the spreading lug 12 into the receiving bore 3, 4 in the printed circuit board 2.

FIG. 1 further shows an undercut 13 on the inside 14 of the outer part 5, which undercut forms a part of a latching connection for fastening the inner part to the outer part 5. FIG. 1 also shows the insertion opening 10 formed as the through-bore; it can be seen that the insertion opening 10 and the undercut 13 are arranged on opposite side walls of the wall of the outer part 5.

Figure 2:
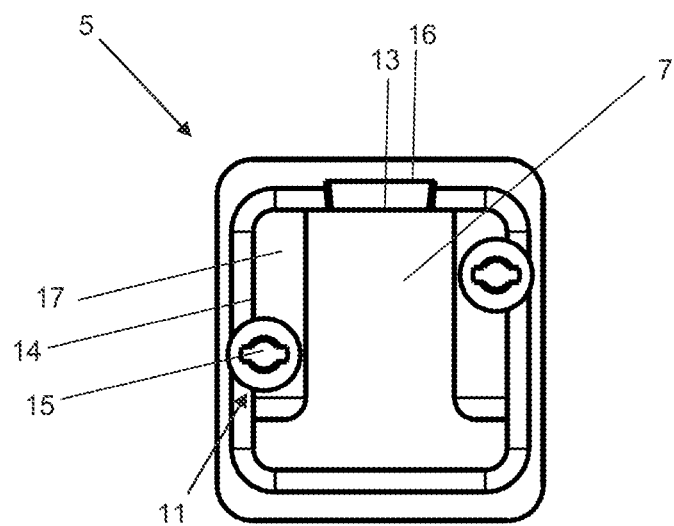
FIG. 2 is a plan view of the outer part from FIG. 1.

FIG. 2 is a plan view of the outer part 5 of the soldering aid looking down on the printed circuit board. A spreading gap 15 can be seen between the two opposite spreading lugs of the spreading member 11; also visible is the inner contour, which is hollow-cylindrical in some portions, of each of the spreading lugs 12 on the opposite insides of the spreading lugs 12.

The plan view from FIG. 2 also shows that a guide groove 16 extends on the inside 14 of the outer part from a top edge of the outer part 5 toward the bottom edge of the outer part 5, the guide groove 16 reaching as far as the undercut 13 such that the latching projection formed on the inner part (FIGS. 3 and 4) and interacting with the undercut 13 to establish the latching connection is guided by the guide groove 16 until, once the assembly position is reached, the latching connection between the inner part 6 and the outer part 5 is established by the latching projection engaging behind the undercut 13.

FIG. 2 also shows that a shoulder is formed in the receptacle 7 in each case on two opposite side walls and on opposite side walls of the inside 14 that encircles the receptacle 7. One of the two shoulders is denoted by reference numeral 17 and is used, together with the opposite shoulder, as a stop that limits the displacement of the inner part 6 in the outer part 5 in the receptacle, vertically into the plane of the drawing from FIG. 2. For this purpose, a bottom edge of the inner part 6 has a stop portion that interacts with the shoulder 17. Increasing the wall thickness in the region of the shoulders 17 of the outer part 5 serves to form the spreading members 11 in that, for example, material is pushed out from the shoulders 17 such that the spreading lugs 12 of the spreading members 11 can be formed.

FIG. 2 also shows that the receptacle 7 of the outer part 5 is formed as an opening that is enclosed by the side walls of the wall of the outer part 5.

Figure 3:
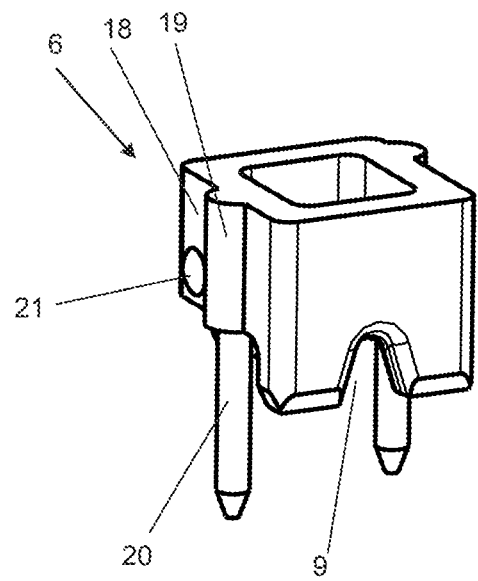
FIG. 3 is a perspective view of an inner part of the embodiment example of the soldering aid according to the invention, details of which are shown in FIG. 1 and FIG. 2.

FIG. 3 is a perspective view of the inner part 6 of the soldering aid. It can be seen that two identical cylindrical portions are formed on an outside 18 of the inner part 6, one of which is denoted by reference numeral 19. The cylindrical portion 19 interacts with a portion on the inside of the outer part 5 such that a guide-surface pair is formed together with a portion of the inside 14 of the receptacle 7 of the outer part, said portion being in permanent contact with the cylindrical portion 19 during the displacement of the inner part 6 relative to the outer part 5. For this purpose, the cylindrical portion 19 extends from the top edge of the inner part 6 along the entire displacement path of the inner part 6 in the outer part 5, as far as the lower boundary of the inner part 6. In particular, it can be seen that, in some portions on the outside 18, the inner part 6 forms a guide-surface pair together with a portion of the inside of the receptacle 7 of the outer part 5, wherein the portion 19, forming the guide-surface pair, of the outside 18 of the inner part 6 is substantially cylindrical. In particular, two guide-surface pairs are formed and are formed on opposite side walls of the inner part 6 and outer part 5.

FIG. 3 further shows that two identical spreading pins are formed on the inner part 6, one of which is provided with reference numeral 20. Each spreading pin 20 protrudes from a lower boundary of the inner part 6 substantially perpendicularly to the surface of the printed circuit board 2 and interacts with the relevant spreading gap 15 of the relevant spreading member 11 on the outer part 5 in such a way that, in the assembly position, each spreading pin 20 fills the relevant spreading gap 15 between the spreading lugs 12, which are arranged opposite in pairs, such that the spreading lugs 12 are braced against the printed circuit board 2. In the assembly position, the outer part 5 is thus fixed in place on the printed circuit board 2.

In this case, each spreading pin 20 is formed as a cylindrical peg that tapers conically at the end, the cylindrical peg having a diameter that is slightly oversized compared with the diameter of the spreading gap 15 (FIG. 2), said oversize being such that the spreading pin 20 press-fits the spreading lugs 12 of each of the spreading members 11 against the inner wall of the receiving bores 3, 4 in the printed circuit board 2. In particular, it is possible for the fastener, specifically the at least one spreading member 11, to cause the outer part 5 to be fixed in place on the printed circuit board 2 when the spreading pin 20 is displaced into an end position in the spreading gap 15. For this purpose, the fastener can be actuated into the assembly position by displacing the inner part 6, together with which each spreading pin 20 is formed in one piece, such that when the spreading pin 20 is in the end position in the spreading gap 15, the fastening member, namely the spreading member 11, definitively and non-releasably fixes the outer part 5 in place on the printed circuit board. In particular, the spreading member 11 is fastened to the printed circuit board, and thus actuated, only when each spreading pin 20 is in the end position in the spreading gap 15, whereas before the end position is reached the spreading member 11, and thus the outer part 5, is still releasably arranged on the printed circuit board.

FIG. 3 further shows the insertion opening 9 in the inner part 6, which insertion opening is formed as a groove that is open toward the printed circuit board 2, i.e., in the direction of the displacement of the inner part 6 in relation to the outer part 5.

FIG. 3 likewise shows that a securing portion is formed on the outside 18 of the inner part 6; the securing portion is formed in particular as studs 21. On two opposite side walls on the outside 18, the inner part 6 in each case has a securing portion formed as studs 21; only one of the two studs is denoted by reference numeral 21. Each stud 21 protrudes beyond the substantially planar outside 18 of the relevant side wall and interacts with a complementary receiving portion on the inside of the outer part 5. In this case, a receiving portion that is substantially complementary to the securing portion, namely to the relevant stud 21, is formed on the inside 14 of the outer part 5, the receiving portion being formed as a depression, which is complementary to the stud 21, in the inside 14 of the outer part 5. In a secured position, the securing portion, namely the relevant stud 21, is substantially interlockingly received in the receiving portion, which has a shape that is complementary to the stud 21, namely in the recess or depression that is complementary to the stud 21.

Figure 4:
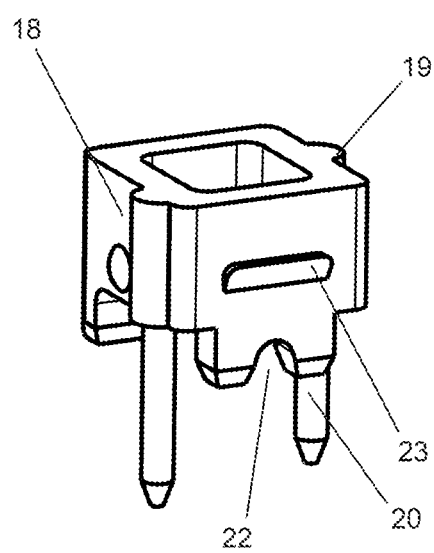
FIG. 4 is a perspective view of the inner part from FIG. 3, rotated through 180°.

FIG. 4 shows the inner part 6 in a view that has been rotated through approximately 180° compared with the illustration in FIG. 3.

It can be seen that an ancillary insertion opening 22 is provided opposite the insertion opening 9 in the inner part 6 in the direction of the extension of the stranded core. The ancillary insertion opening 22 is formed as a groove that is open toward the surface of the printed circuit board 2, i.e., in the direction of the displacement of the inner part 2 toward the assembly position. The ancillary insertion opening 22 is formed on a bottom edge of the side wall, said bottom edge being opposite the side wall in which the insertion opening 9 is formed.

Together with the insertion opening 9 in the inner part 6, the ancillary insertion opening 22 can receive and secure the stranded core at two portions; for example, the insertion opening 9 can secure the stranded core close to the sheath edge of the stripped portion of the cable, and the ancillary insertion opening 22 can secure the stranded core in a portion remote from the sheath edge, for example the free end of the stranded core or an intermediate portion of the stranded core between the free end of the stranded core and the portion of the stranded core that is close to the sheath edge.

FIG. 4 further shows that a latching projection 23 is formed on the outside 18 of the inner part 6 and establishes the latching connection together with the undercut 13 on the inside 14 of the outer part 5 (FIGS. 1 and 2). The interaction between the latching projection 23 and the undercut 13 allows the inner part 6 to be fastened to the outer part 5 in the assembly position by means of the latching connection once the assembly position has been reached.

The latching projection 23 is formed as a molding that extends transversely to the direction of the displacement of the inner part 6 and protrudes beyond the substantially planar adjoining outside 18 toward the inside 14 of the outer part 5, and possibly also as a cut-out lug.

Figure 5:
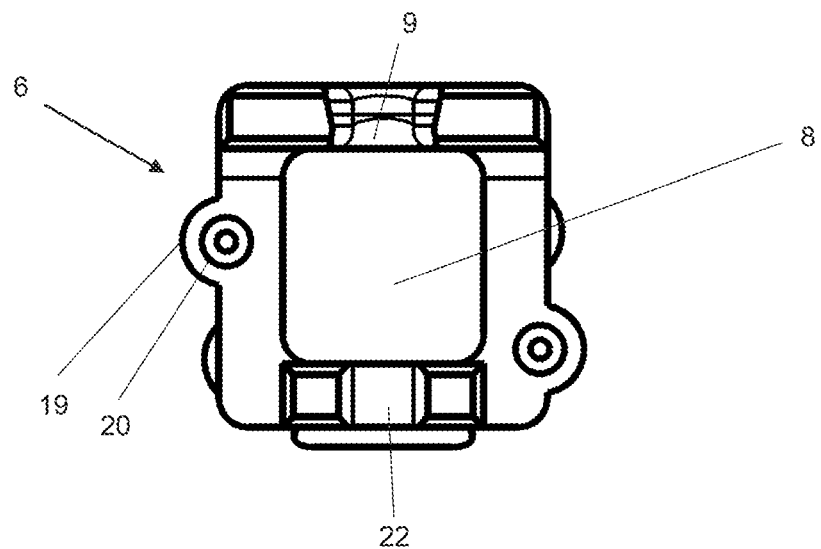
FIG. 5 is a view from below of the inner part shown in FIG. 3 and FIG. 4.

FIG. 5 is a view from below the inner part 6, looking away from the surface of the printed circuit board 2 substantially along a central axis of the access opening 8.

It can be seen that the ancillary insertion opening 22 is opposite the insertion opening 9 along an imaginary line that corresponds to the longitudinal extension of the exposed stranded core. Furthermore, the spreading pins 20, which taper conically at the end and are formed in an extension of the cylindrical portions 19, can also be seen. The figure also shows how the studs 21 are arranged on the outside of the same side wall on which the spreading pins 20 and the cylindrical portions 19 are also formed. It can also be seen that the access opening 8 has a substantially rectangular peripheral contour, through which, in the assembly position, access to the contact surface, which is received inside the opening in the access opening 8 at least in some portions, is possible for, by way of example, a laser beam or a heating finger, each for supplying thermal energy to melt the solder material.

FIG. 6 shows the outer part 5 and the inner part 6, which are still supplied as separate components.

Figure 7:
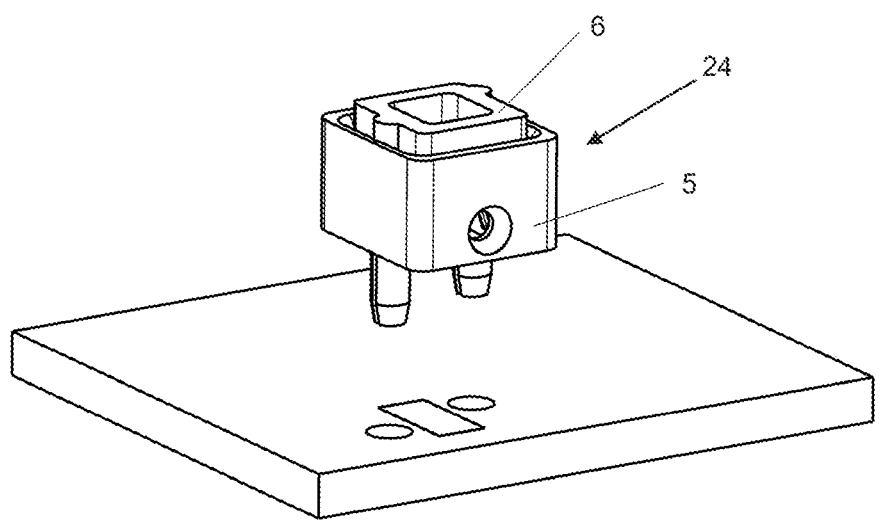
FIG. 7 is a perspective view of the embodiment example of the soldering aid according to the invention shown in FIG. 1 to FIG. 6, during the production of the assembly according to the invention from FIG. 6, and of a further method step in the example implementation of the method according to the invention after FIG. 6.

FIG. 7 shows a pre-secured module 24, the inner part 6 being displaced in relation to the outer part 5 into a secured position, and the inner part 6 and the outer part 5 forming the pre-secured module 24 when in the secured position. In the secured position, the inner part 6 and the outer part 5 can be separated from one another only by applying a defined force, so the pre-secured module 24 can be supplied as a pre-assembled component.

Figure 8:
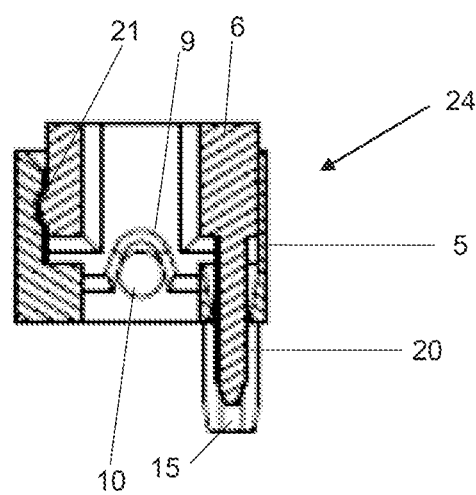
FIG. 8 is a sectional perspective view of the embodiment example of the soldering aid according to the invention shown in FIG. 1 to FIG. 7.

FIG. 8 is a section through the pre-secured module 24. It can be seen that, in the secured position of the soldering aid, the studs 21 on the inner part 6 engage in the cavities on the outer part 5 that are complementary to the studs 21, thus allowing the inner part 6 to be pre-secured to the outer part 5, in a manner that is in principle still releasable. It can also be seen that the spreading pin 20 on the inner part 6 has been inserted into the spreading gap 15 but not yet displaced into an end position. It can further be seen that, in the embodiment example shown, the insertion opening 9 in the inner part 6 is already substantially aligned with the insertion opening 10 in the outer part 5 when in the secured position, such that the stranded core, which is oriented in a straight manner, can be inserted through the two insertion openings 9, 10. Accordingly, the ancillary insertion opening 22 (FIGS. 4 and 5) is also aligned with the two insertion openings 9, 10 (above the plane of the drawing in FIG. 8).

Figure 9:
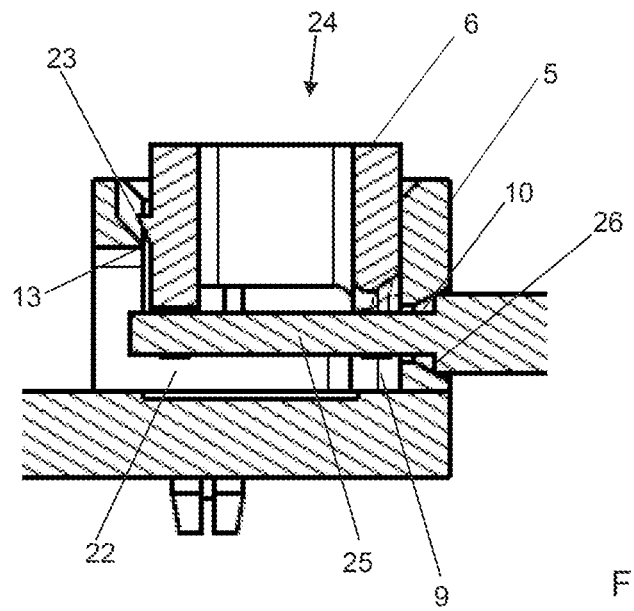
FIG. 9 is a partially sectional view of the embodiment example of the soldering aid according to the invention shown in FIG. 1 to FIG. 8, of the embodiment example of the assembly according to the invention shown in FIG. 6 and FIG. 7, and of a further method step in the example implementation of the method according to the invention.

FIG. 9 shows the soldering aid, or the module 24 shown in FIG. 8, in an inserted position, the insertion opening 9 in the inner part 6 being aligned, when in the inserted position, with the insertion opening 10 in the outer part 5 for inserting the stranded core 25 of the cable. It can also be seen that the insertion opening 10 in the outer part 5 is formed to conically taper such that a sheath edge 26 can be received and supported; for this purpose, the sheath edge 26 rests on the conically tapering surface of the insertion opening 10 in the outer part 5. It can further be seen that the stranded core 25 likewise extends through the ancillary insertion opening 22 in the inner part 6. In the inserted position, the stranded core 25 of the cable extends, in a substantially straight manner, through the insertion openings 9, 10 in the inner part 6 and in the outer part 5, respectively, which openings are oriented in line with one another, in particular aligned with one another. In this case, the cable having the stranded core 25 is held by a gripper of a robot arm and moved in the insertion direction.

In a modification of the embodiment example shown, the insertion opening in the outer part is not formed to conically taper but rather, for example, is formed to be cylindrical but with a step, the diameter decreasing suddenly in the region of the step such that the step acts as an insertion stop when the sheath edge abuts the step.

The illustration in FIG. 9 shows that the latching projection 23 on the inner part 6 has not yet engaged behind the undercut 13 on the outer part 5, so the outer part 5 is not yet definitively fixed in place on the inner part 6. In principle, the stranded core 25 could still be moved counter to the insertion direction out of the inserted position shown in FIG. 9.

FIG. 9 also shows that, in the inserted position, at least the outer part 5 is already arranged on the printed circuit board such that the fastener 11 extends through the receiving bore 3, 4 but without already being fastened to the receiving bore 3, 4. FIG. 9 shows a case in which the pre-secured module shown in FIGS. 7 and 8 has already been produced before the fastener 11 is inserted into the receiving bores 3, 4, the outer part 5, which is then pre-secured to the inner part 6, of said module being inserted into the receiving bores 3, 4.

Figure 10:
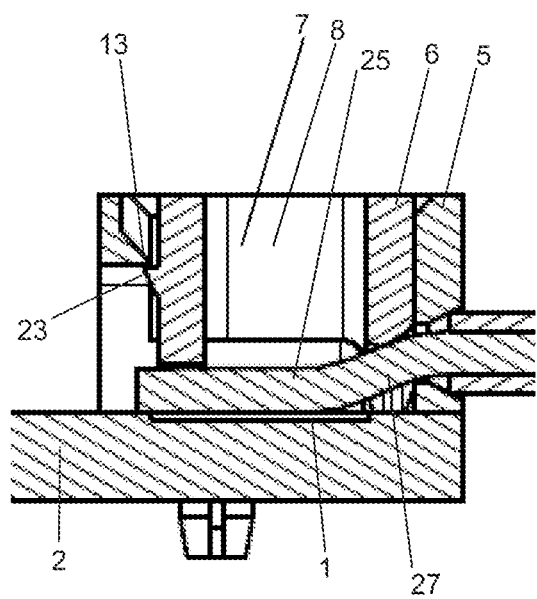
FIG. 10 is a partially sectional view of the embodiment example of the soldering aid according to the invention shown in FIG. 1 to FIG. 9, of the assembly shown in FIGS. 6, 7 and 9, and of a further method step in the example implementation of the method according to the invention.

FIG. 10 shows the soldering aid in the final assembly position. From the inserted position shown in FIG. 9, the soldering aid can be moved into the assembly position shown in FIG. 10 by displacing the inner part 6 into an end position in relation to the outer part 5.

It can be seen in the illustration in FIG. 10 that the latching projection 23 on the inner part 6 has engaged behind the undercut 13 on the outer part in such a way that the outer part 5 is fastened to the inner part 6. Owing to the displaceability of the inner part 6 inside the receptacle of the outer part 5, it is also possible for the stranded core 25 to be held in a manner pressed against the contact surface 1 of the printed circuit board 2, such that the stranded core 25 can be soldered to the printed circuit board 2 in a subsequent working step; for this purpose, it is possible to access the stranded core through the access opening 8 in the inner part in order to supply thermal energy, for example by means of a laser beam or a heating finger.

FIG. 10 also shows that, in the assembly position, the insertion opening 9 in the inner part 6 is arranged in a manner offset from the insertion opening 10 in the outer part 5, the result being that the stranded core has a portion 27, which is bent substantially in a stretched S-shape, in the region of the insertion opening 9 in the displaceably guided inner part 6, which insertion opening is formed as a groove that is open toward the printed circuit board 2 in the displacement direction. In relation to the extension of the cable, the stranded core 25 thus rests on the contact surface 1 so as to be offset in parallel compared with the extension direction of the cable. The bent portion 27 of the stranded core 25 in the region of the soldering aid, in particular in the region of the insertion opening 9 in the inner part 6 in the assembly position, provides the advantage whereby the stranded core 25 can be additionally protected against withdrawal forces such that it is much more difficult for the stranded core 25 to be withdrawn counter to the insertion direction. In this case, the withdrawal forces occurring when the stranded core 25 is withdrawn are absorbed by the inner part 6, and thus indirectly by the soldering aid, which, in the assembled position, forms a captively joined unit formed of the inner part 6 and the outer part 5, which were previously supplied structurally separately.

What cannot be seen in FIG. 10 is that the displacement of the inner part 6 in relation to the outer part 5 causes the spreading pin 20 on the inner part 6 to move into its end position in the spreading gap 15 of the spreading lugs 12 of the spreading member 11 on the outer part 5, such that overall the outer part 5, and thus the soldering aid, is captively arranged on the printed circuit board 2 by means of the fastener formed as the actuatable spreading member 11, as explained above in relation to FIG. 8.

FIG. 10 further shows an assembly comprising the printed circuit board 2 and the stranded core 25 of the cable, the stranded core 25 being fastened on the contact surface 1 of the printed circuit board 2 by means of the above-described soldering aid, and wherein, when in the assembly position, the soldering aid is in particular configured as a unit formed by the inner part 6, which has the access opening 8 to the contact surface 1, fastened to the outer part 5.

In the assembly position of the soldering aid shown in FIG. 10, it can also be seen that the inner part 6 is entirely received inside the receptacle 7 of the outer part 5. In particular, a top edge of the inner part 6 does not protrude beyond the top edge of the outer part 5 but rather is flush therewith, such that the inner part 6 inside the receptacle 7 of the outer part 5 is no longer visible when viewed in parallel with the plane of the surface of the printed circuit board 2.

With reference to the above-described FIG. 6 to FIG. 10, a preferred implementation of a method according to the invention for securing a stranded core of a cable on an electrical contact surface 1 of a printed circuit board 2 will now be explained:

In a first method step, shown by way of example in FIG. 6, the outer part 5 and the inner part 6 of the soldering aid, which inner part is displaceably arranged inside the receptacle 7 of the outer part 5, are supplied as initially separate components.

In a possible implementation of this first method step, the outer part 5 can be positioned on the printed circuit board 2 and then the inner part 6 can be inserted into the receptacle 7 of the outer part 5.

In an alternative preferred implementation of the first method step, the soldering aid is supplied in a secured position, the inner part 6 is first inserted into the receptacle 7 of the outer part 5, and the unit is then supplied as a pre-secured module 24, the pre-secured module 24 being positioned on the printed circuit board 2, and specifically before the stranded core is inserted into the pre-secured module 24. This implementation of the first method step has been explained above with reference to FIGS. 7 and 8.

In a second method step, which has been explained above with reference to FIG. 9, the stranded core of the cable is provided in an inserted position; in the inserted position, the insertion opening 9 in the inner part 6 is aligned with the insertion opening 10 in the outer part 5 for inserting the stranded core, which in particular is oriented in an elongate straight manner.

In a third method step, which has been explained above with reference to FIG. 10, the inner part 6 inside the receptacle 7 of the outer part is moved into an assembly position, in particular by being displaced in a direction perpendicular to the surface of the printed circuit board and perpendicular to the extension of the previously inserted stranded core. In this assembly position, the inner part 6 is captively fastened to the outer part 5. In addition, in this assembly position, the access opening 8 in the inner part 6 makes the electrical contact surface 1 of the printed circuit board 2 accessible to such an extent that thermal energy, in particular in a laser beam, can reach the stranded core and the contact surface from the exterior, through the access opening 8 of the inner part 6, in order to heat and melt the solder material. In the final assembly position reached in the third method step, the outer part 5 is also definitively captively fastened to the printed circuit board 2.

The invention has been described above with reference to FIG. 1 to FIG. 10 on the basis of an embodiment example in which the soldering aid was intended for receiving a single stranded core 25 of the cable.

Figure 11:
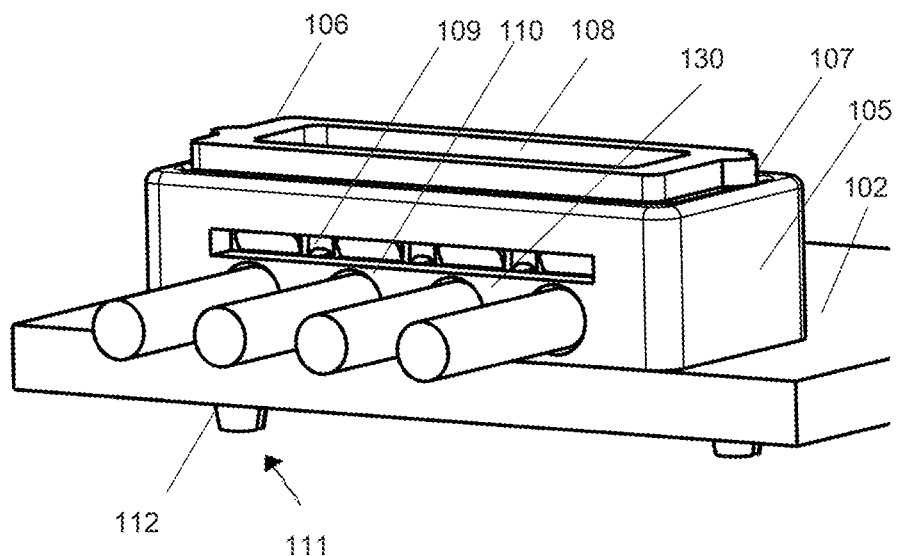
FIG. 11 is a perspective view of a first embodiment example, which is an alternative to the embodiment example shown in FIG. 1 to FIG. 10, of a soldering aid according to the invention and of an assembly according to the invention.

FIG. 11 shows a modified soldering aid intended for receiving and securing a plurality of stranded cores (four stranded cores in the first alternative embodiment example shown) of four respective structurally separate cables, each of the stranded cores being assigned an electrical contact surface on a shared printed circuit board 102.

It can be seen that the soldering aid comprises an outer part 105, which is shared by all the stranded cores and has a bearing surface for resting on the surface of the shared printed circuit board 102, and furthermore comprises an inner part 106, which is shared by all the stranded cores and is displaceably received inside a shared receptacle 107 of the outer part 105, the inner part 106 having an access opening 108 to the contact surface, this access opening being shared by all the stranded cores. In an assembly position, the inner part 106 can be fastened to the outer part 105, for example by means of two fastening members 111 arranged on the outer part 105 and each formed as spreading members 112.

In the inner part 106, a separate insertion opening is provided for each stranded core; just one of the insertion openings is provided with reference numeral 109. Each of the insertion openings is formed as an open groove, such that adjoining open grooves merge into one another.

In the outer part 105, a separate insertion opening is provided for each stranded core; just one of the insertion openings is denoted by reference numeral 110. Each insertion opening 110 is formed as a through-bore. Adjacent insertion openings are separated from one another and each spaced apart by a ridge 130.

In the inserted position shown in FIG. 11, each of the insertion openings 109 in the shared inner part 106 is aligned with a respective insertion opening 110 in the shared outer part 105 for inserting the relevant stranded core.

The cables having the exposed stranded cores at each stripped cable end are gripped by a gripper arm of a robot, in a manner oriented in parallel with one another, and are simultaneously inserted through the insertion openings 109 in the inner part 106 and the insertion openings 110 in the outer part 105 that are aligned therewith.

Figure 13:
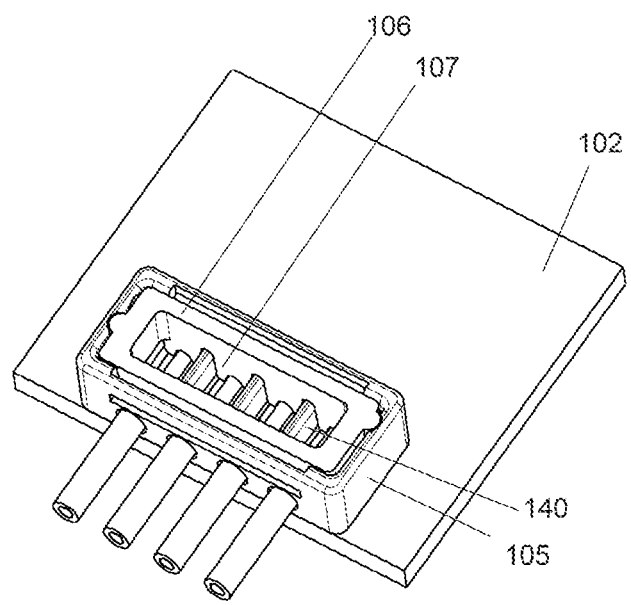
FIG. 13 is a perspective view of the first alternative embodiment example shown in FIG. 11, viewed in a different direction from FIG. 11.

FIG. 13 shows the embodiment example described in FIG. 11 from a different viewing direction. It can be seen that one rib is arranged between each two adjacent stranded cores in the region of the shared receptacle 107 of the outer part 105; just one of the three ribs between the total of four stranded cores is denoted by reference numeral 140. Each rib 140 is formed on the outer part 105 and extends from the inside of the front wall to the inside of the back wall, in each case based on the insertion direction of the stranded cores. Precisely one stranded core is received between each two ribs; in particular, each two ribs separate precisely one contact surface such that a short circuit between adjacent stranded cores or between adjacent contact surfaces is prevented by the ribs. In addition, each rib 140 prevents liquefied solder from being able to reach an adjacent contact surface.

In a modification of the embodiment example shown in FIG. 13, the inner part 106 has wall portions, the wall portions being formed in such a way in relation to the ribs 140 of the shared outer part 105 that the wall portions each form, together with the ribs, an approximately continuous separating wall such that one separating wall is formed between each two adjacent contact surfaces or between each two adjacent stranded cores.

In the embodiment example described with reference to FIG. 11 and FIG. 13, a shared inner part 106 was provided for all the stranded cores. All the stranded cores can be secured simultaneously by displacing the shared inner part 106 in relation to the shared outer part 105. In a modification of the embodiment example described with reference to FIG. 11 and FIG. 13, a plurality of inner parts are received inside the shared receptacle 107 of the shared outer part 105, each guided in a displaceable manner; in particular, precisely one inner part can be provided for each of the stranded cores, and the respective displacement and fastening to the shared outer part 105 of said inner parts enable precisely this stranded core to be secured on the contact surface assigned to that stranded core. In particular, in certain assembly situations, it can be advantageous to secure all the stranded cores one after the other rather than simultaneously.

Figure 12:
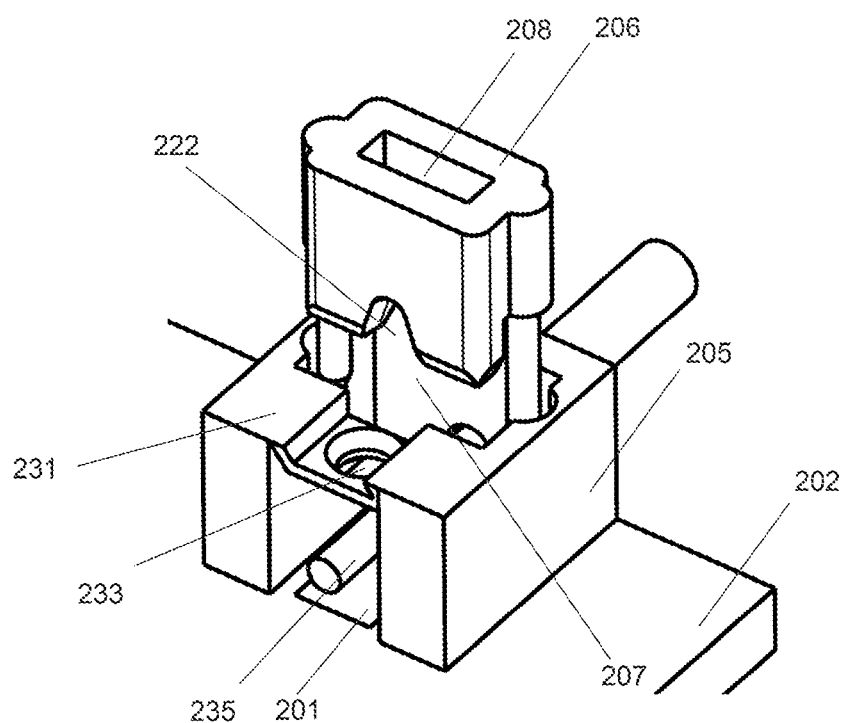
FIG. 12 is a perspective view of a second embodiment example, which is an alternative to the embodiment examples shown in FIG. 1 to FIG. 11, of a soldering aid according to the invention and of an assembly according to the invention.

FIG. 12 shows a second embodiment example of a soldering aid, which is an alternative to the embodiment example described in FIG. 1 to FIG. 10. In a departure from the above-described embodiment example, in addition to the access opening in the inner part, which is displaceably arranged inside a receptacle of the outer part, an additional access opening is provided in the outer part, which access opening allows for further access to the stranded core secured on the contact surface in order to supply, for example, thermal energy through the additional access opening, in particular to the free end of the stranded core, or, for example, to be able to mechanically secure the free end of the stranded core.

For this purpose, for the soldering aid it is provided that an inner part 206 is shortened in the direction of the extension of the stranded core and is displaceably received inside an accordingly shortened receptacle 207 of an outer part 205, wherein at least one side wall of the outer part 205, namely the side wall 231 of the outer part 205 opposite the insertion opening for the stranded core, is formed having an increased wall thickness. Owing to the increased wall thickness, it is possible to provide an additional access opening 233 in this region, which access opening extends substantially in parallel with the shortened receptacle 207 and allows for further access to the stranded core in parallel with and regardless of the access opening 208 of the inner part 206, which access opening is shortened in the extension direction of the stranded core. In particular, it is possible for the inner part 206 to have an ancillary insertion opening 222 which receives an intermediate portion of the stranded core, which intermediate portion is arranged between the free end 235 of the stranded core and a portion of the stranded core clamped close to the edge in the insertion opening in the inner part 206, and braces it against the contact surface 201 of the printed circuit board 202. The free end 235 of the stranded core is then accessible through the additional access opening 233 for further processing.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

1 Contact surface
2 Printed circuit board
3 Receiving bore
4 Receiving bore
5 Outer part
6 Inner part
7 Receptacle
8 Access opening
9 Insertion opening in the inner part 6
10 Insertion opening in the outer part 5
11 Spreading member
12 Spreading lug
13 Undercut
14 Inside of the outer part 5
15 Spreading gap
16 Guide groove
17 Shoulder
18 Outside of the inner part 6
19 Cylindrical portion
20 Spreading pin
21 Stud
22 Ancillary insertion opening
23 Latching projection
24 Pre-secured module
25 Stranded core
26 Sheath edge
27 Bent portion of the stranded core 25
102 Shared circuit board 105 Shared outer part
106 Shared inner part
107 Shared receptacle
108 Shared access
109 Insertion opening in the shared inner part 106
110 Insertion opening in the shared outer part 105
111 Spreading member on the shared outer part 105
112 Spreading lug
130 Ridge
140 Rib
205 Outer part
206 Inner part
207 Receptacle
208 Access opening
222 Ancillary insertion opening
231 Side wall of the receptacle
233 Additional access opening
235 Free end of the stranded core

The invention claimed is:

1. A soldering aid for securing a stranded core of a cable on an electrical contact surface of a printed circuit board, the soldering aid comprising:
an outer part having a receptacle and a bearing surface; and
an inner part that is fastenable to the outer part in an assembly position in which the inner part is displaceably received inside the receptacle of the outer part, the inner part having an access opening through which the contact surface is accessible in the assembly position, and
wherein, in an inserted position of the inner part in the outer part, an insertion opening in the inner part is aligned with an insertion opening in the outer part for inserting the stranded core of the cable.

2. The soldering aid according to claim 1, wherein, in one or more portions on an outside of the inner part, the inner part forms a guide-surface pair together with a portion of an inside of the receptacle of the outer part.

3. The soldering aid according to claim 2, wherein the one or more portions forming the guide-surface pair of the outside of the inner part is/are substantially cylindrical.

4. The soldering aid according to claim 1, wherein the inner part is fastenable to the outer part by a latching connection in the assembly position.

5. The soldering aid according to claim 4, wherein a latching projection is formed on an outside of the inner part and establishes, in the assembly position, the latching connection together with an undercut on the inside of the outer part.

6. The soldering aid according to claim 1, wherein a fastener configured to fix the soldering aid in place on the printed circuit board is disposed on the outer part and/or on the inner part.

7. The soldering aid according to claim 6, wherein the fastener is actuatable by displacing the inner part into the assembly position.

8. A soldering aid for securing a stranded core of a cable on an electrical contact surface of a printed circuit board, the soldering aid comprising:
an outer part having a receptacle and a bearing surface; and
an inner part that is displaceably received inside the receptacle of the outer part, the inner part having an access opening through which the contact surface is accessible and being fastenable to the outer part in an assembly position, and
wherein, in an inserted position of the inner part in the outer part, an insertion opening in the inner part is aligned with an insertion opening in the outer part for inserting the stranded core of the cable,
wherein a fastener configured to fix the soldering aid in place on the printed circuit board is disposed on the outer part and/or on the inner part, and
wherein the fastener is disposed on the outer part and is formed as a spreading member having two or more spreading lugs forming a spreading gap, and wherein a spreading pin is formed on the inner part and fills the spreading gap in the assembly position such that the spreading lugs can be braced against the printed circuit board.

9. The soldering aid according to claim 1, wherein the inner part is movable in relation to the outer part into a secured position, and wherein the inner part and the outer part form a pre-secured module in the secured position.

10. The soldering aid according to claim 1, wherein a securing portion is formed on an outside of the inner part, and wherein a receiving portion that is substantially complementary to the securing portion is formed on an inside of the outer part, and wherein, in a secured position, the securing portion is received in the receiving portion in a substantially interlocking manner.

11. The soldering aid according to claim 10, wherein the securing portion is formed as studs and the receiving portion is formed as a recess having a shape that is complementary to the studs.

12. The soldering aid according to claim 1, wherein the insertion opening in the inner part is formed as a groove that is open in a direction of movement of the inner part toward the inserted position.

13. The soldering aid according to claim 1, wherein the insertion opening in the outer part is formed as a through-bore.

14. A soldering aid for securing a stranded core of a cable on an electrical contact surface of a printed circuit board, the soldering aid comprising:
an outer part having a receptacle and a bearing surface; and
an inner part that is displaceably received inside the receptacle of the outer part, the inner part having an access opening through which the contact surface is accessible and being fastenable to the outer part in an assembly position,
wherein, in an inserted position of the inner part in the outer part, an insertion opening in the inner part is aligned with an insertion opening in the outer part for inserting the stranded core of the cable, and
wherein, in the assembly position, the insertion opening in the inner part is arranged in a manner offset from the insertion opening in the outer part.

15. The soldering aid according to claim 1, wherein the inner part includes an ancillary insertion opening disposed opposite the insertion opening in the inner part in a direction of extension of the stranded core.

16. The soldering aid according to claim 1, wherein the inner part and/or the outer part is/are formed as a single-piece molded part made of a metal or a plastics material.

17. The soldering aid according to claim 1, wherein, in the assembly position, the inner part is entirely received inside the receptacle of the outer part.

18. An assembly comprising a printed circuit board and a stranded core of a cable, wherein the stranded core is fastened on a contact surface of the printed circuit board by the soldering aid according to claim 1.

19. A method for securing a stranded core of a cable on an electrical contact surface of a printed circuit board, the method comprising:
- providing a soldering aid comprising an outer part and an inner part, which is displaceably received inside a receptacle of the outer part;
- inserting the stranded core of the cable into the soldering aid in an inserted position of the inner part in the outer part, in which an insertion opening in the inner part is aligned with an insertion opening in the outer part for inserting the stranded core of the cable; and
- moving the inner part inside the receptacle of the outer part into an assembly position in which the inner part is fastened to the outer part, wherein, in the assembly position, an access opening in the inner part makes the electrical contact surface of the printed circuit board accessible, and wherein the outer part is fastened to the printed circuit board in the assembly position in order to secure the stranded core on the contact surface.

20. The method according to claim 19, wherein the soldering aid is provided in a secured position in which the inner part and the outer part form a pre-secured module, and the pre-secured module is arranged on the printed circuit board before the stranded core is inserted.

21. The method according to claim 19, further comprising soldering the stranded core of the cable to the contact surface by applying solder and heat through the access opening.

22. The soldering aid according to claim 1, wherein the access opening is formed as an opening surrounded by a wall of the inner part.

23. The soldering aid according to claim 1, wherein, in the assembly position, the inner part is fastened to the outer part and the outer part is fastened to the printed circuit board such that the access opening encloses the contact surface and solder and heat is introducible through the access opening to solder the stranded core of the cable to the contact surface.

* * * * *